Sept. 4, 1956 K. F. UMPLEBY 2,762,002

POWER AMPLIFIER FOR SERVO MECHANISMS

Filed May 29, 1952 3 Sheets-Sheet 1

*INVENTOR.*
KENNETH F. UMPLEBY

*BY*

*Killman, Kerst and Ofund*
ATTORNEYS

Sept. 4, 1956 K. F. UMPLEBY 2,762,002

POWER AMPLIFIER FOR SERVO MECHANISMS

Filed May 29, 1952 3 Sheets-Sheet 2

*INVENTOR.*
KENNETH F. UMPLEBY

*BY*

*Killman, Kerst and Pfund*
ATTORNEYS

Sept. 4, 1956 K. F. UMPLEBY 2,762,002

POWER AMPLIFIER FOR SERVO MECHANISMS

Filed May 29, 1952 3 Sheets-Sheet 3

INVENTOR.
KENNETH F. UMPLEBY

BY

Killman, Kerst and Pfund
ATTORNEYS

United States Patent Office 2,762,002

Patented Sept. 4, 1956

2,762,002

POWER AMPLIFIER FOR SERVO MECHANISMS

Kenneth F. Umpleby, Baltimore, Md., assignor to Bendix Aviation Corporation, Towson, Md., a corporation of Delaware Application May 29, 1952, Serial No. 290,656

10 Claims. (Cl. 318—28)

This invention relates to an improved method and means of power amplification and more particularly to improved arrangements of electro-mechanical systems for obtaining power amplification as employed in servo-mechanisms or the like.

The power amplifier of the present invention will first be described in a system for producing proportional control of mechanical power in response to a relatively low level control signal. A modification of this system will then be described in a servomechanism application in which it is employed to automatically orient the directional characteristic of a loop antenna in a radio compass. Heretofore prior art systems of the general type here disclosed have been relatively complex and required means which were relatively inefficient in obtaining a desired amount of power amplification. Such systems have been wasteful of space and weight, as well as being relatively expensive to construct. These considerations become of increasing importance with the advanced designs which emphasize miniaturization and economical manufacture as well as reliability of operation.

Accordingly, it is a primary object of this invention to provide improved methods and means of power amplification.

Another object is to provide an improved, compact servo amplifier or the like which is economical to manufacture and reliable in operation.

A further object is to provide a servo amplifier achieving a high order of power gain with relatively simple apparatus.

Another object is to provide an improved power amplification system which achieves a high order of immunity to noise by the employment of mechanical resonance.

Another object is to provide an improved mechanical power amplifier which may provide proportional control or essentially full power control of the desired sense in response to the control signal.

A further object is the provision of such systems which are relatively immune to external forces to which the apparatus is subjected.

These and other objects will become more readily apparent from the following detailed description taken in conjunction with the accompanying drawings, wherein.

The invention is here disclosed in embodiments which utilize an alternating polarity wave as the primary power source. This wave may be a conventional alternating current or may be obtained from a direct current source by reversing the polarity thereof at a suitable rate or by other well known means. This alternating wave is employed as a carrier signal for the servo data and as the power source for a utilization device such as a servomotor. The control signals or data are employed to modulate the carrier wave derived from the primary power source and this modulated wave is applied to control mechanical switching means interposed between the utilization device and the alternating wave of the primary power source. This arrangement is such that there is provided a phase sensitive system in which the utilization device is essentially directly connected for predetermined intervals to the primary power source with a polarity which is determined by the control signal. By suitably controlling the intervals during which the utilization device is connected to the power source, proportional control may be had or, if desired, full "on" power of the desired polarity may be obtained.

Figure 1:
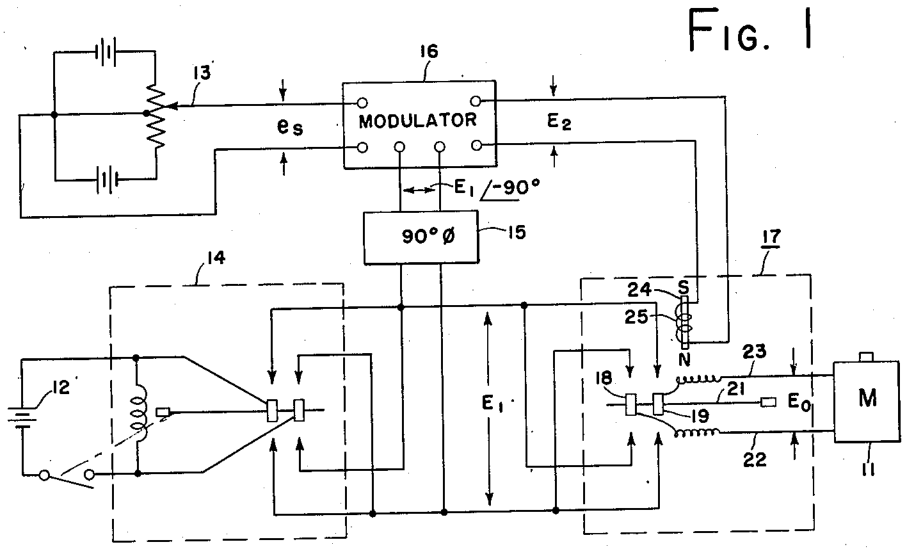
Fig. 1 is a schematic diagram of a mechanical power amplifier employing vibrating reeds.

Referring to Fig. 1, there is shown a power amplifier system in accordance with the present invention, wherein a motor 11 is driven from a D. C. power source 12 in accordance with the polarity and magnitude of a control signal means 13. The power from source 12 is converted into an alternating polarity voltage $E_1$ by means of a vibratory converter 14. Any other means for producing alternating voltage $E_1$ may be employed for the purposes of this invention and it need not necessarily be a wave of rectangular form. For example, ordinary sinusoidal A. C. power may be employed as the source of the voltage $E_1$. The voltage $E_1$ may be passed through a 90° phase shifting device 15 if desired, as will be hereinafter explained. The output of the phase shifter 15 is the voltage $E_1$ at an angle of $-90°$ and this voltage is applied to a modulator 16. Modulator 16 has impressed upon the input terminals thereof a signal voltage $e_s$ from the signal means 13. The action of the modulator 16 is to produce an output voltage $E_2$ which is in-phase or out-of-phase with the phase delayed voltage $E_1$ $-90°$ applied to the modulator 16, depending upon the polarity of the signal $e_s$; the voltage $E_2$ has a magnitude which is proportional to the magnitude of the voltage $e_s$.

The voltage $E_2$ from the modulator 16 is applied to control the deflection of a vibratory switch, generally designated 17. The switch 17 is essentially a double-pole, double-throw switch with relatively stationary contacts connected to $E_1$ in a manner to provide reversing connections thereto of the movable contacts 18 and 19. The contacts 18 and 19 are mounted on a vibrating reed 21 and are insulated therefrom and from each other. Flexible leads 22 and 23 are connected to the contacts 18 and 19 and serve as stationary output conductors for the switch 17 without deleterious effect on the vibrating action of the reed 21. The reed 21 is of the type which may be set in motion by the action of magnetic forces and may be magnetically biased by a permanent magnet 24. The deflecting force on the reed 21 is thus made sensitive to the sense of the magnetic force produced in a coil 25 by the voltage $E_2$. As the voltage $E_2$ generates a current in the coil 25, producing a magnetic field in aiding or opposing relation to the field of the permanent magnet 24, the deflecting force on the reed 21 will have a sense corresponding to the polarity of the applied signal $E_2$. The leads 22 and 23 provide the output voltage $E_0$ of the switch 17 which may be applied to a utilization device such as the motor 11, thereby controlling the direction of rotation thereof in accordance with the polarity of the voltage $E_0$.

An important feature of the present invention which results in improved power amplifier characteristics of the system is the construction of the reed 21 and the contacts and connections and other moving parts associated therewith to vibrate with a mechanical resonance at the frequency of the alternating voltage $E_1$. Under these conditions, the mechanical power to keep the vibrating portions of the switch 17 in motion may be made extremely small and the mechanical resonance has an equivalent Q which makes the switch operation relatively immune to noise components of the voltage $E_2$. These features obviously greatly simplify the requirements which must be supplied from the voltage $E_2$ in that relatively small amounts of signal power are sufficient for proper operation and the signal may contain relatively large amounts of noise power or frequency components different from the frequency of $E_1$.

It is to be noted that the operation of the system may be satisfactory in some applications without the mechanical resonance of the vibrating portions of the switch 17. This would occur, for example, where a sufficient amount of power was available in signal $E_2$ to mechanically drive a non-resonant reed 21 and where the signal $E_2$ was obtained in sufficiently pure form by means of electrical filtering or the like. In the non-resonant operation of the switch 17 the phase shifting device 15 is obviated, inasmuch as the deflection of the mechanical system will be in phase with the deflecting force produced by the voltage $E_2$. Conversely, the operation of a resonant switch 17 employs the phase shifting device 15 because, in general, the deflection of the reed 21 in a resonant system will have other than in-phase relation with respect to the deflecting force produced by the voltage $E_2$ and may be, for example, 90°. These alternative arrangements thus provide switching connections of the contacts 18 and 19 to the voltage $E_1$ in phase with the reversals thereof, for resonant and non-resonant systems as will presently be described.

Figure 2:
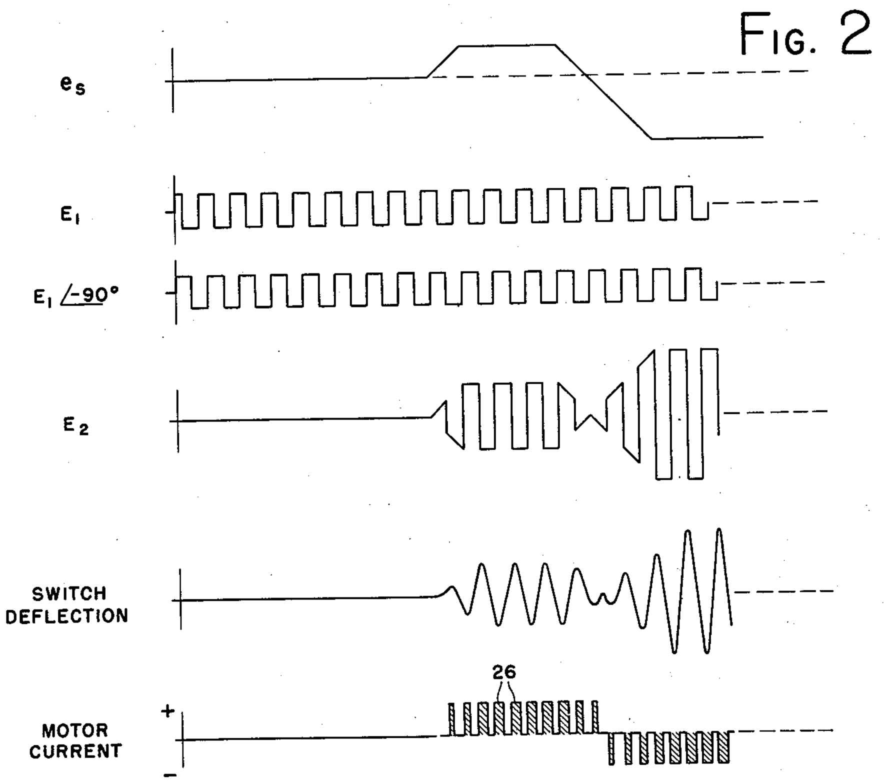
Fig. 2 is a time diagram useful in explaining the operation of the arrangement of Fig. 1.

Referring now to Fig. 2, the operation of the system of Fig. 1 for a typical signal will be described for the case of a resonant vibrating system. The voltage $e_s$ has an arbitrary form including positive, negative, and zero magnitude portions. Voltage $E_1$ is a rectangular wave resulting from reversibly connecting to the battery 12 at a predetermined rate through the action of the vibrator 14. The voltage $E_1$ phase delayed by an angle of 90° is applied to the modulator 16 and is shown as a rectangular waveform, although this particular waveform is not required for the proper operation of the system and, in general will not remain of rectangular form after phase delay in the device 15. The voltage $E_2$, as shown, is an alternating waveform which has an in-phase relation with the delayed voltage $E_1$ for one polarity of the signal $e_s$ and has a phase opposition relation with the delayed voltage $E_1$ for the other polarity of the signal $e_s$. The magnitude of the voltage $E_2$, however, is proportional of the magnitude of the $e_s$. The application of the voltage $E_2$ in the form of a deflecting force to the resonant reed 21 produces a switch deflection which tends to be sinusoidal and in 90° phase relation with the deflecting force due to the voltage $E_2$. The switch deflection is thus in phase with the reversals of the wave $E_1$ from the primary power source. The deflection of the switch 17 may be utilized to obtain proportional control of the current supplied to the motor 11 by suitably spacing the stationary contacts of the switch 17 from the rest position of the movable contacts 18 and 19. This condition is indicated by the variable width hatched rectangles 26 which represent the intervals and the polarity of current flow through the leads 22 and 23. This action is accomplished through the variation in time taken by the sinusoidal switch deflection to reach the predetermined amplitude where connection with the fixed contacts is made for the varying peak amplitude of the deflection. In other words, for a small amplitude sinusoidal deflection switch contact will be made for only a small portion during the cycle, whereas for large amplitude deflections near the limiting deflection of the system, switch contact will be made during substantially all of each half cycle of the sinusoid. For proportional control the period of time spent by the contacts 18 and 19 in traveling the distance between connection to the stationary contacts must be an appreciable portion of the period of a cycle of the wave $E_1$ for the lowest ampliude signal $E_2$ which the system will recognize.

Figure 3:
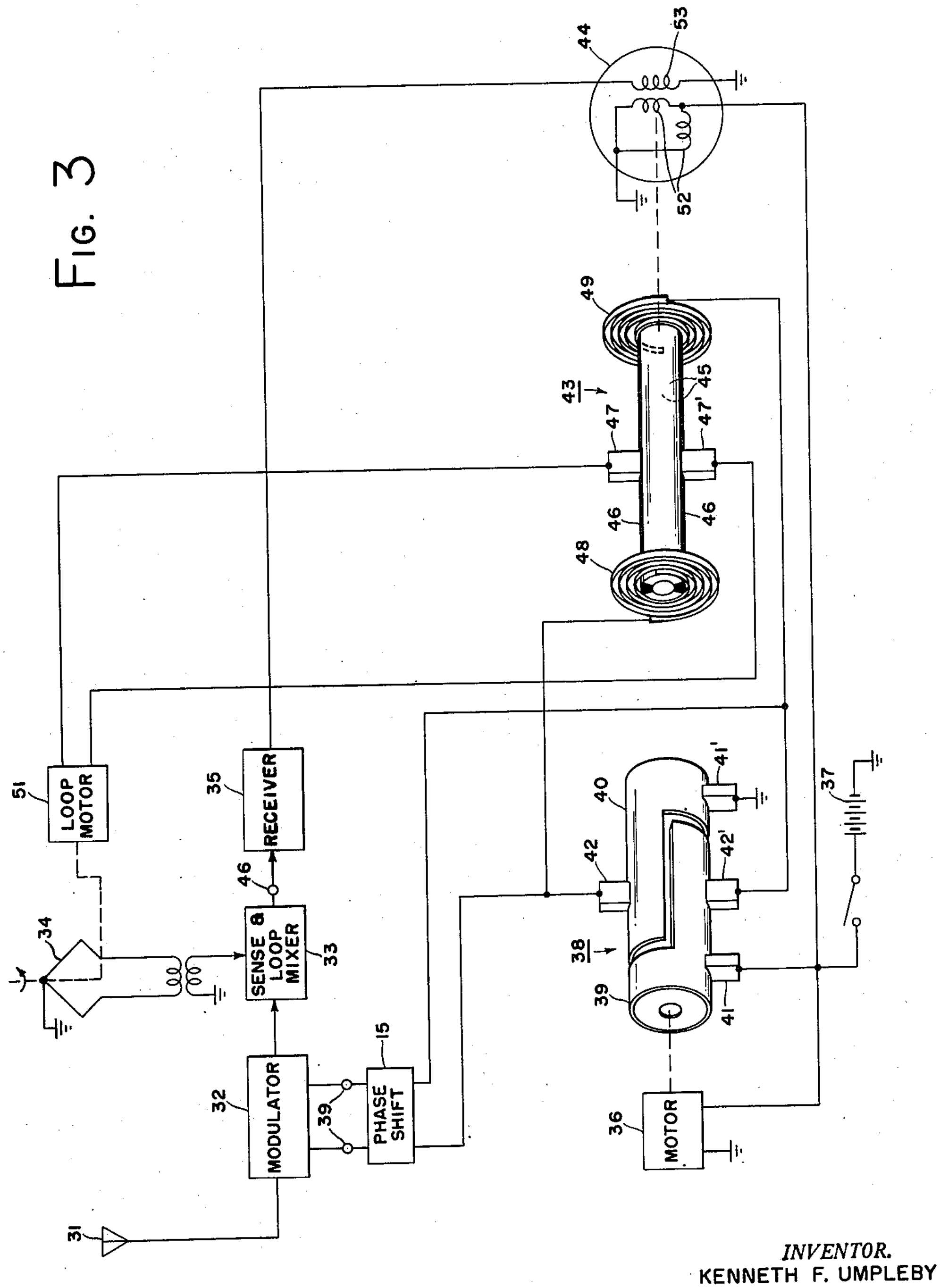
Fig. 3 is a schematic diagram of a self-orienting radio compass employing a servomechanism in accordance with the present invention.

Referring now to Fig. 3, a modification of the present invention is shown as utilized for a servomechanism in a radio compass. In this modification a rotational power amplifier is employed which provides a high degree of immunity to translational shock and vibration forces. A sense antenna 31 receives radio signals which are periodically reversed in phase in a modulator 32 in response to polarity reversals of the alternating power source, as will be described, and then supplied to a mixer 33. A loop antenna 34 is fixedly coupled to the mixer 33, although it will be understood that the modulator 32 can be interchanged between the loop and sense antenna circuits as a matter of choice in a particular equipment. The mixer 33 combines the loop and sense antenna signals and supplies the combined signals to a radio receiver 35 in a manner which is well known.

The servomechanism of the radio compass, in accordance with the present invention, includes a constant speed motor 36, which is energized from a battery 37 which constitutes the primary power source for the equipment. The motor 36 drives a slip ring and commutator device, generally designated 38, which is made up of two insulated portions 39 and 40. The slip ring areas of the portions 39 and 40 are continuously connected, through wipers 41, 41′, across the battery 37 and the commutator sections of the portions 39 and 40 are alternately contacted, respectively, by a pair of brushes 42, 42′. The brushes 42, 42′ are connected through a phase shifter 15, if desired, to the modulator 32 for controlling the aforementioned phase reversals thereof and to an electro- mechanical vibrator, generally designated 43.

The electro-mechanical vibrator 43 comprises a self-synchronous motor 44 such as, for example, the type known in the trade as an Autosyn, which reversibly drives a commutator with two insulated conducting sectors 45. In place of the Autosyn 44 any suitable torque motor may be used which is rotational direction sensitive to the polarity of the applied current. The commutator 45 has diametrically opposed insulated portions 46 which are sufficiently wide to accommodate a pair of brushes 47, 47′ thereon without contacting either of the conducting portions of the commutator. The commutator 45 is yieldably secured to the fixed frame of the motor 44 by means of helical springs 48 and 49 which provide an undeflected center position such that the insulated portions 46 of the commutator 45 are resting beneath the brushes 47 and also serve to conduct current from brushes 42, 42′ to the respective commutator segments 45. The system may be designed so that the entire rotating mass of the commutator and the rotor of the motor 44 form, with the restoring force from the deflection of the springs 48, 49, a mechanically resonant system tuned to the same frequency as the alternating wave produced at the brushes 42, 42′ by the rotation of the motor 36. The brushes 47, 47′ are connected to energize a reversible loop motor 51 which is mechanically coupled to rotate the directional position of the loop 34. The torque motor 44 is energized from the battery 37 which is connected to stator windings 52 thereof and from the output of the receiver 35 which is connected to supply the output signal thereof to the rotor winding 53.

Figure 4:
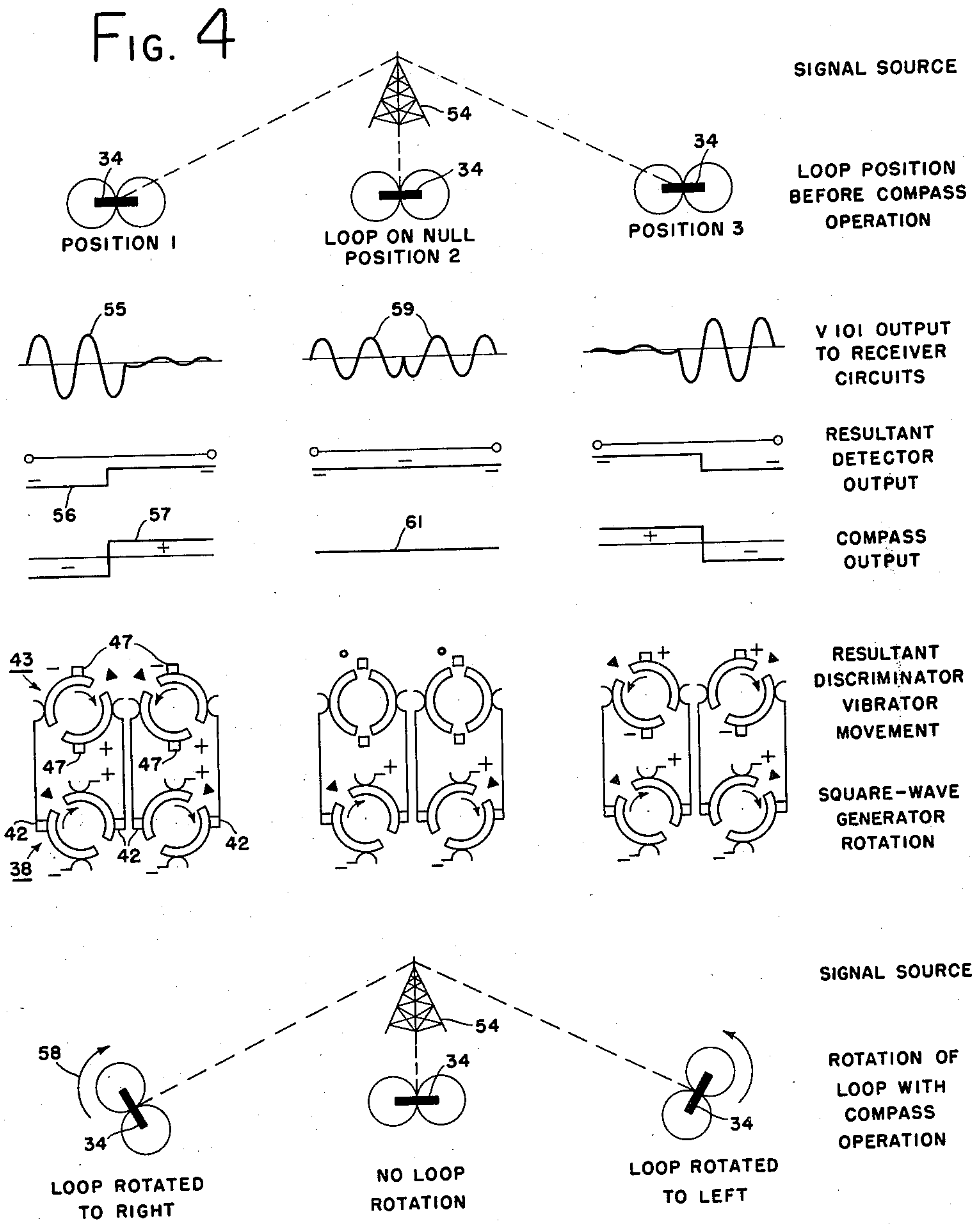
Fig. 4 is a diagram useful in describing the operation of the radio compass of Fig. 3.

The operation of the radio compass system will not be described with reference to Fig. 4. Fig. 4 is arranged in three vertical columns to represent various signals and conditions in the system for three relative positions of the vehicle carrying the radio compass system and the radio signal source, as indicated at the heading of each column by the diagrammatic representation of the loop antenna 34 with respect to a source of radio signals 54. The operation will be described specifically for the condition depicted as position 1, from which the operation of the system for the conditions depicted at position 2 and 3 will be apparent. Initially, the compass will be energized by connecting the motor 36 to the battery 37, thereby generating at the brushes 42, 42′ and alternating square wave of voltage having a frequency of, say, 10 cycles per second depending on the speed of the motor 36. The receiver 35 will be tuned to receive signals of the frequency of the source 54.

The radio compass produces, in a manner which is well known, signals from the sense and loop antennas which add or subtract in the receiver 35 to produce a square wave modulated radio frequency signal which has a peak amplitude in accordance with the additive values of the signals from the two antennas and a minimum value according to their differences. The values of these signals are adjusted to provide a square wave modulated signal 55. The square wave modulated signal 55, is received by the radio receiver 35 which produces a stepped valued unidirectional voltage 56 in the detector circuit therefrom. The signal 56 is A. C. coupled and amplified to produce an output signal 57 which is a square wave of the same frequency as that produced by the commutator 38 and which has a fixed phase relation thereto for a given orientation of the loop 34 with respect to the source 54. The signal 57 energizes the winding 53 of the Autosyn 44, causing it to tend to rotate in opposite directions for each half cycle thereof. The restoring force of the spiral springs 48 and 49 is such that the maximum deflection of the vibrator 43 never exceeds ±90°. Under these conditions the commutator conductive sectors 45 alternately connect to respective brushes 47, 47′ and thus energize the brushes 47, 47′ from the battery 37 with a polarity in accordance with the instantaneous deflection of the commutator 18 and the polarity of the voltage of brushes 42. Since the square wave voltage at the brushes 42, 42′ and the output square wave 57 from the receiver 35 have a fixed predetermined phase relation, they will reverse polarities together, resulting in a constant unipolarity voltage at the brushes 47, 47′, all resulting from the rotary motion of the commutator 38 in combination with the oscillatory motion of the commutator 43. This unipolarity voltage at the brushes 47, 47′ is connected to the loop motor 51 in a manner to cause rotation to orient the loop null in the direction of the signal source 54. The direction of rotation of the loop 34 is indicated in Fig. 4 by the arrow 58, thereby establishing a rest position in which the combined sense and loop antenna signals produce a null voltage in the following well known manner.

The operation of the system for a loop orientation which produces a null voltage is shown in the position 2 column of Fig. 4. The null signal corresponds to equal and opposite phased signals 59 which produce a zero voltage output 61 from the receiver 35. The concomitant absence of energization in the winding 53 permits the commutator 43 to remain at rest in the neutral position with the brushes 47, 47′ contacting the insulating portions 46. There is thus no tendency for the motor 51 to rotate the loop 34 unless the aligned position is changed.

Obviously, many modifications may be made in the embodiments of the present invention, here disclosed, without departing from the teachings hereof.

What is claimed is:

1. A servomechanism for providing mechanical motion from an alternating current power source in accordance with an error signal comprising, means for combining said signal with a wave from said source for producing a modulated wave having an amplitude proportional to said signal and a predetermined phase or phase-opposition relation to said current in accordance with the sense of said error signal, a reversible motor having a pair of input terminals and oppositely directed motion for opposite polarity currents applied thereto, means actuated by the motion of said motor for varying the value of said error signal, a frame, a commutator rotatably supported on said frame and having a pair of conductive segments separated by a pair of non-conductive segments, at least one spiral spring coaxial with the axis of said rotation resiliently connecting said commutator to said frame, said spring establishing an undeflected normal position for said commutator and the motional system associated with said commutator being mechanically resonant at the frequency of said wave, a pair of brushes for said commutator positioned to rest on said non-conductive segments for said undeflected position, means for driving said commutator in oscillatory motion in response to said alternating wave and in phase with the alternations of said current, and circuit means including said commutator and said brushes for energizing said motor from said source for deflected positions of said commutator to reduce said error signal.

2. A servomechanism for providing mechanical motion from an alternating current source in accordance with an error signal comprising, means responsive to said signal and a wave from said source for producing an alternating wave of the frequency of said current, said alternating wave having a predetermined phase or phase-opposition relation to said alternating current in accordance with the sense of said error signal, a reversible motor having a pair of input terminals and oppositely directed motion for opposite polarity currents applied thereto, means actuated by the motion of said motor for varying the value of said error signal, a frame, a leaf spring cantilever supported on said frame, a pair of movable contacts insulatedly supported on said leaf spring near the free end thereof, pairs of relatively fixed contacts positioned on said frame for contacting by said moving contacts, respectively, upon predetermined deflection of said spring in opposite directions, the motional system associated with said spring being mechanically resonant at the frequency of said wave, means for deflecting said spring in oscillatory motion in response to said alternating wave and in phase with the alternations of said current, and circuit means including said fixed and movable contacts for energizing said motor from said source for deflected positions of said spring to reduce said error signal.

3. An automatic direction finding signal receiver comprising, a commutator having a pair of contacting portions separated by a pair of non-contacting portions, means resiliently positioning said commutator in an undeflected normal position, a pair of brushes for said commutator positioned to rest on said non-contacting portions for said undeflected position, a source of electric energy of alternating polarity, receiving means having a directional characteristic for deriving a directional signal having a predetermined phase relation to said energy and a reversible phase relation corresponding to orientation of said directional characteristic on opposite sides of the bearing line of said signals, means for rotating said directional characteristic, means for driving said commutator in oscillatory motion in response to and in predetermined phase with said directional signal, and circuit means including said computator and said brushes for energizing said directional characteristic rotating means from said source for deflected positions of said commutator, whereby said characteristic is aligned with said bearing.

4. A device according to claim 3 in which the deflectable portions of said commutator and said driving means therefor with said resilient means form a mechanically resonant system for said oscillatory motion at the frequency of the alternations of said polarity.

5. An automatic direction finding signal receiver comprising, a commutator having a pair of contacting portions separated by a pair of noncontacting portions, means resiliently positioning said commutator in an undeflected normal position, a pair of brushes for said commutator positioned to rest on said non-contacting portions for said undeflected position, a source of electric energy of alternating polarity, a rotatable loop antenna and a nondirectional antenna, means including a radio receiver connected to said antennas and said source for producing a direct current that changes polarity with said alternating polarity and reverses said changes when the loop antenna is displaced in opposite directions from a balance position with respect to a preselected radio transmitter and increases in magnitude with the displacement of said loop, a reversible motor for rotating said loop, means for driving said commutator in oscillatory motion in response to said direct current with a predetermined relation between the deflection of said commutator and the polarity of said direct current, and circuit means including connections through said commutator and said brushes for energizing said motor from said source for deflected positions of said commutator.

6. A device according to claim 5 in which the deflectable portions of said commutator and said driving means therefor with said resilient means form a mechanically resonant system for said oscillatory motion at the frequency of said alternating polarity.

7. An automatic direction finding signal receiver comprising, switch means having two pairs of conductors and means for reversibly connecting respective conductors of said pairs, means resiliently positioning said connecting means in an undeflected non-connected normal position, a source of electric energy of alternating polarity, receiving means having a directional characteristic for deriving a directional signal having a predetermined phase relation to said energy and a reversible phase relation corresponding to orientation of said directional characteristic on opposite sides of the bearing line of said signals, means for rotating said directional characteristic, means for driving said switch means in oscillatory motion in response to and in predetermined phase with said directional signal, and circuit means including said switch means for energizing said directional characteristic rotating means from said source for connected positions of said pairs, whereby said characteristic is aligned with said bearing.

8. A device according to claim 7 in which the deflectable portions of said switch and said driving means therefor with said resilient means form a mechanically resonant system for said oscillatory motion at the frequency of said alternating polarity.

9. A servo amplifier for supplying amplified power from an alternating current source in accordance with a control signal comprising, means responsive to said signal and a wave from said source for producing an alternating wave of the frequency of said current, said alternating wave having a predetermined phase or phase-opposition relation to said alternating current in accordance with the sense of said control signal and amplitude varying in accordance with the amplitude of said control signal, a utilization device having a pair of input terminals, mechanical switch means including means movable between two positions in response to said alternating wave and in synchronism therewith, said movable means when in one of said positions applying said alternating current to said input terminals in one sense and when in the other of said positions applying said alternating current to said input terminals in a second sense differing in phase from said one sense by 180°, and means applying said alternating wave to said switch means to move said movable means between said two positions in a manner such that said input terminals have said alternating current applied thereto as a pulsating unidirectional current the sense of which is the same as the sense of said control signal and the duration of the pulses of which is a function of the amplitude of said control signal.

10. A servo mechanism for providing mechanical motion from an alternating current source in accordance with a D. C. error signal comprising, a reversible motor having a pair of input terminals and oppositely directed motion for opposite polarity currents applied thereto, mechanical switch means for alternating said input terminals between two conditions in one of which the output of said alternating current source is applied to said input terminals in one sense and in the other of which the output of said alternating current source is applied to said input terminals in a second sense having a 180° phase difference from said one sense, means responsive to alternating current of the frequency of said source to drive said switch means in synchronism with the output of said source, and means providing alternating current of said frequency to said driving means, the last named means comprising means shifting the phase of a portion of the output of said source by a fixed amount, and means modulating said phase shifted portion in amplitude in accordance with the amplitude of said error signal and reversing the phase thereof as said error signal changes sense, whereby said input terminals are alternated between said two conditions in synchronism with the said output of said source to produce an input voltage to said motor having the sense of said error voltage and a magnitude which is a function of the magnitude of said error voltage.

References Cited in the file of this patent

UNITED STATES PATENTS

| | | |
|---|---|---|
| 2,247,029 | Luck | June 24, 1941 |
| 2,308,521 | Lear | Jan. 19, 1943 |
| 2,449,859 | Penfold et al. | Sept. 21, 1948 |
| 2,484,134 | Wald | Oct. 11, 1949 |
| 2,569,698 | Shepard | Oct. 2, 1951 |
| 2,584,954 | Williams | Feb. 5, 1952 |
| 2,605,465 | Brailsford | July 29, 1952 |

OTHER REFERENCES

Theory of Sermomechanisms, pp. 108, 109 James, Nichols, Phillips, McGraw-Hill Book Co., 1947.